United States Patent [19]

Watanabe et al.

[11] Patent Number: 4,841,484
[45] Date of Patent: Jun. 20, 1989

[54] TRI-STATE IIL GATE

[75] Inventors: Kazuo Watanabe, Takasaki; Makoto Furihata, Gunma; Kouichi Yamazaki, Takasaki, all of Japan

[73] Assignee: Hitachi, Ltd., Tokyo, Japan

[21] Appl. No.: 832,694

[22] Filed: Feb. 25, 1986

[30] Foreign Application Priority Data

| Feb. 25, 1985 | [JP] | Japan | 60-34341 |
| Feb. 25, 1985 | [JP] | Japan | 60-34342 |
| Apr. 24, 1985 | [JP] | Japan | 60-86373 |
| Apr. 24, 1985 | [JP] | Japan | 60-86398 |

[51] Int. Cl.$^4$ .......... H03K 19/02; H03K 19/092; G11C 11/00
[52] U.S. Cl. .......... 365/190; 307/443; 307/473; 307/475; 307/477; 307/296.3; 365/154
[58] Field of Search .......... 307/473, 475, 477, 443, 307/200 A, 200 B; 365/154, 190

[56] References Cited

U.S. PATENT DOCUMENTS 4,390,802 6/1983 Woltz .......... 307/477

FOREIGN PATENT DOCUMENTS

| 0143223 | 6/1978 | Japan | 307/471 |
| 0080156 | 7/1978 | Japan | 307/477 |
| 0158051 | 7/1978 | Japan | 307/471 |

Primary Examiner—S. D. Miller
Assistant Examiner—M. R. Wambach
Attorney, Agent, or Firm—Antonelli, Terry & Wands

[57] ABSTRACT

A semiconductor integrated circuit device comprising a logic circuit which is constituted by using tri-state IIL gates. The tri-state IIL gates are particularly arranged to have first and second inputs. If the second input has a first level, the circuit will operate as a normal IIL circuit to provide high and low outputs in response to the first input. However, if the second input has a second level, the circuit will provide a floating output regardless of the first input. The transistors of the IIL circuit can be formed in an island in the substrate, with the potential of the island serving as the second input. In a preferred arrangement, the first level of the second input can be obtained by grounding the island while the second level is obtained by disconnecting the island from ground. These tri-state IIL gates are particularly advantageous to form a transfer gate for an IIL memory similar to the transfer gates used for MOS memories. They can also be used for forming various other logic gate arrangements.

25 Claims, 10 Drawing Sheets

TRI-STATE IIL GATE

BACKGROUND OF THE INVENTION

The present invention relates to a semiconductor device equipped with a logic circuit employing integrated injection logic (hereinafter referred to as IIL's).

Multi-functional IC's employing bipolar elements (hereinafter referred to as bipolar IC's) having a variety of functions have been realized due to the progress in electronics engineering and a high degree of customer demand.

A logic arrangement adapted to bipolar IC's can be represented by an IIL which can be formed by the same process as that used for the production of bipolar elements, and which can further be highly densely integrated.

The inventors have forwarded the study regarding bipolar IC's in an attempt to produce an IC having more functions and a larger scale by using the above-mentioned IIL's. From their studies, they have found that, in forming a logic circuit of a large scale, it is essential to provide a bipolar logic circuit with a circuit which is capable of completely controlling the transmission of signals by clock signals in the same manner as a transfer gate or a clocked inverter consisting of MOSFET's.

SUMMARY OF THE INVENTION

A representative example of the invention is described below briefly.

1. A logic circuit is constituted using tri-state IIL gates.

The tri-state IIL is an IIL gate which produces outputs of three values, i.e., outputs of a high (H) level, low (L) level, a and floating condition. The output of the floating condition is produced by disconnecting the emitter of an inverse npn transistor from a reference potential (usually, a grounding point).

The tri-state IIL gate of this simple structure is very effective to enhance the performance of a bipolar IC, to increase the degree of integration, and to reduce the consumption of electric power. A representative example is described below.

(i) A bipolar random access memory (RAM) is constituted using the tri-state IIL gate as a transfer gate A serious defect inherent in the conventional bipolar RAM is that there is no means for electrically completely isolating a memory cell from a pair of complementary data lines. In other words, there is no counterpart for a transfer gate used in the typical MOS-type RAM. Because of this shortcoming in conventional bipolar RAM's, crosstalk develops between non-selected cells and a selected cell when data is to be written into or read out from a memory cell among a plurality of memory cells.

The above problem, however, is solved if the tri-state IIL gate is used as the transfer gate. Moreover, the tri-state IIL can be controlled by supplying a control signal from a word line to the tri-state IIL. This structure is the same in effect as that of an MOS-type RAM, and makes it possible to obtain a very simply constructed RAM.

(ii) An exclusive NOR circuit and an input signal comparator are constituted using the tri-state IIL gates Use of the tri-state IIL gates makes it possible to compose the above circuits with considerably fewer elements than those of the conventional art, and to increase the degree of integration.

Further, when a floating output is being produced, the tri-state IIL gate consumes no electric current; i.e., the injection current does not flow at all times, unlike the conventional counterparts. Therefore, the consumption of electric power is greatly reduced.

2. Particular arrangements are made with regard to the layout in constituting the logic circuit using tri-stage IIL gates.

Whether the tri-state IIL should produce a floating output is determined by controlling the potential of an island where the IIL is formed. By giving attention to this point, a plurality of IIL gates controlled at the same timing are formed on the same island. Therefore, the plurality of IIL gates are commonly controlled by controlling the island potential, and the structure is simplified.

According to the above structure, furthermore, the isolation regions can be substantially eliminated to reduce the area for layout, and the degree of integration can be increased.

BRIEF DESCRIPTION OF THE DRAWINGS

FIGS. 1(a) to 1(d) are diagrams illustrating the fundamental structure of a tri-state IIL gate, wherein: FIG. 1(a) is a diagram showing the fundamental structure; FIG. 1(b) is a symbolic diagram of the circuit of FIG. 1(a); FIG. 1(c) is a further simplified symbolic diagram of FIG. 1(b); and FIG. 1(d) is a section view of a device constructed in the form of an IC;

FIGS. 9(a) and 9(b) are diagrams showing an embodiment of the present invention, wherein FIG. 9(a) is a circuit diagram extracting only a memory cell portion in the RAM of FIG. 6, and FIG. 9(b) is a plan view of the layout when the memory cell portion in the RAM of FIG. 9(a) is constituted in the form of an IC;

DESCRIPTION OF THE PREFERRED EMBODIMENT

EMBODIMENT 1

A concrete example of a RAM constituted using tri-state IIL gates will be described below in conjunction with the drawings.

In the conventional bipolar RAM as mentioned above, there is no circuit which can completely separate non-selected memory cells from the data lines, such as a transfer gate does in a conventional MOS RAM. Therefore, the sense circuit for reading the data must be constituted in a complex manner, and the sense operation contains a large number of undesired analog elements, making it difficult to guarantee a reliable sense operation.

In the bipolar RAM, memory cells on the selected word line only are activated by supplying a large operation current thereto, and memory cells on other non-selected word lines are maintained in an inactive state by supplying an operation current that is just sufficient to retain the stored contents. Therefore, the contents of the memory cells on the selected word line only can be taken out through a bit line. According to the present invention, however, no such complex operation is required.

FIG. 1 shows a tri-state circuit employing an IIL according to the present invention which operates as described below. When the emitter of an npn transistor is assuming the low level (ground potential) responsive to an input signal IN2, the circuit operates in the same manner as the conventional IIL, i.e., performs the inverter operation.

As the input signal IN2 assumes the high level, a transistor Qp is rendered nonconductive, and the emitter resistance of a transistor Qn becomes infinite, whereby the transistors Qp, Qn are served with no current and are cut off. For example, either the emitter of Qn can be disconnected from ground or a suitable high voltage can be applied to it to effectively make the emitter resistance of Qn infinite. Even if a signal IN1 is input under this condition, no signal is transmitted to the output OUT and a floating condition results. Namely, the input and output are completely isolated from each other.

Figure 1A:
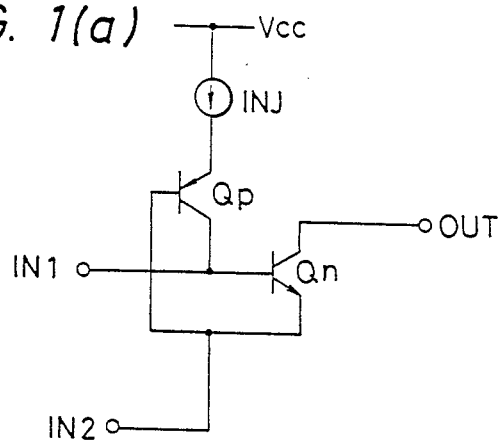
Figure 1B:
Figure 1C:
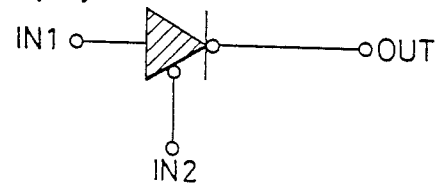
Figure 1D:
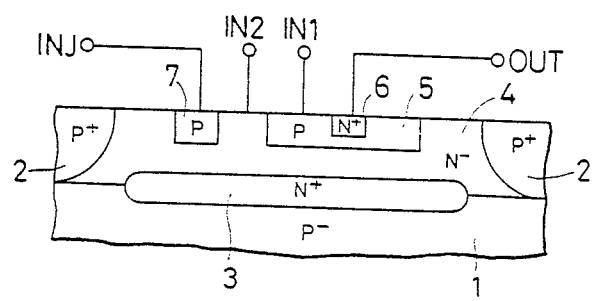

FIG. 1(b) is a diagram which shows the circuit of FIG. 1(a) using logic symbols, FIG. 1(c) is a symbolic diagram of the circuit shown in FIGS. 1(a) and 1(b), and FIG. 1(d) shows how the device can be formed in a semiconductor substrate.

As will be understood from the drawings, the tri-state IIL circuit is not complex in construction and its operation can be switched into the normal condition or floating condition by simply changing the potential of an island where the IIL is formed. This is the case since the input IN2 directly controls the island potential of the island 4 shown in FIG. 2(d) to determine whether the output of the collector region 6 will be floating or not.

Using this tri-state circuit, a logic circuit similar to CMOS can be realized with IIL; i.e., the range of application of IIL can be broadened.

Figure 2:
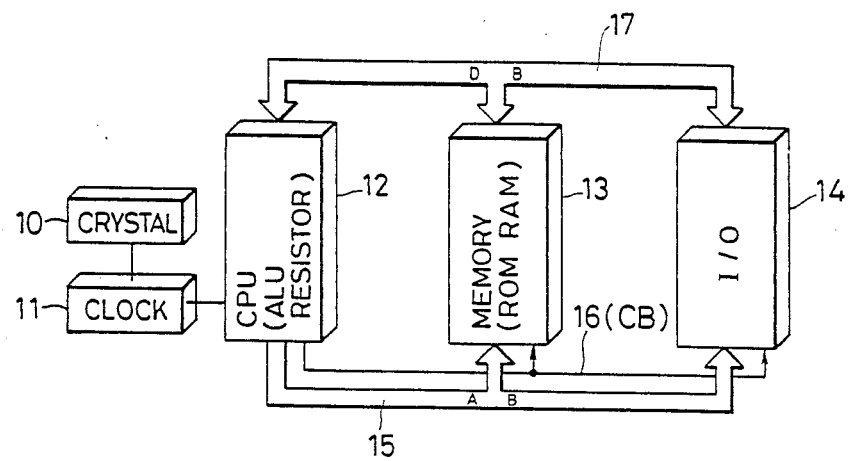
FIG. 2 is a system diagram of a microcomputer.

FIG. 2 is a system diagram of a single-chip microcomputer. The present invention is very effective for constituting a CPU or a memory unit shown in this drawing.

The structure of FIG. 2 will be described below briefly.

The central processing unit (CPU) consists of an arithmetic logic unit and resistors. Fundamental clock pulses generated by a quartz-crystal oscillator 10 are suitably divided for their frequency by a clock generator 11, and a CPU 12 operates in synchronism with the clock pulses generated by the clock generator 11. The CPU 12, memory (MEMORY) 13 and I/O port 14 are coupled together through a data bus (DB) 17, address bus (AB) 15, and control bus (CB) 16.

The bipolar static RAM will be described below in conjunction with the drawings.

Figure 3:
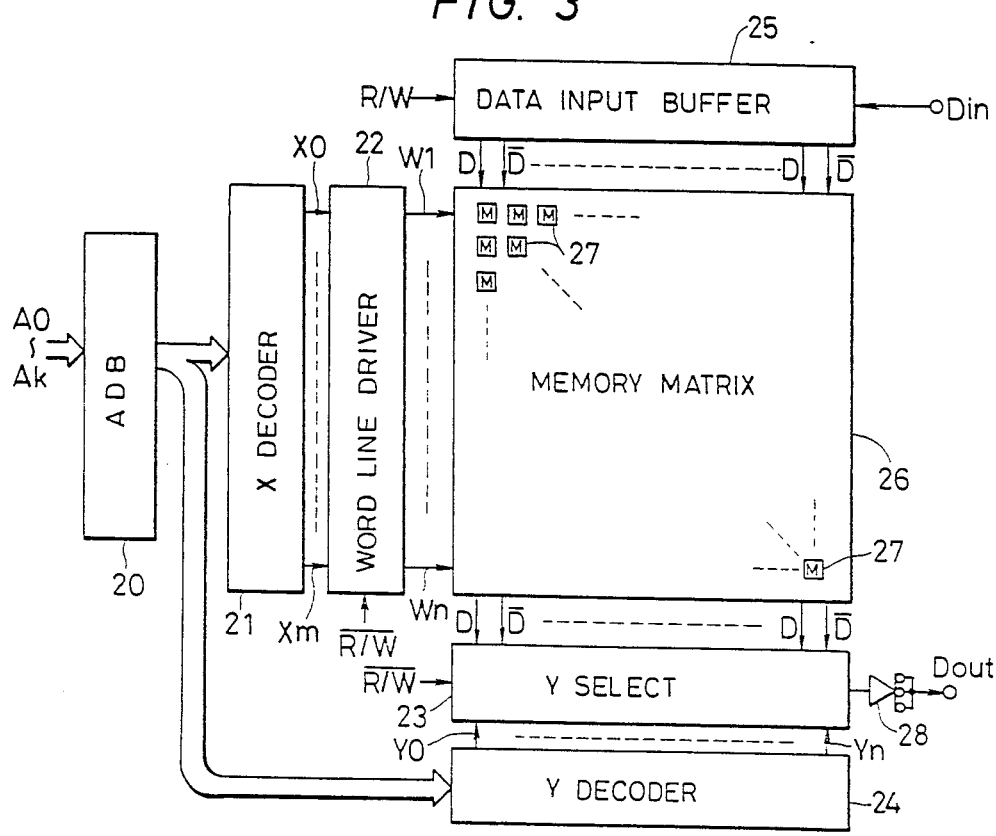
FIG. 3 is a block diagram of an IIL RAM according to the present invention.

FIG. 3 schematically illustrates the whole semiconductor memory according to a first embodiment.

The semiconductor memory consists of a memory matrix 26, a word line driver 22, a data input buffer (DIB) 25, a Y-select circuit 23, ah X-decoder 21, a Y-decoder 24, an address buffer (ADB) 20, and a read output buffer 28.

In the memory matrix 26 are arranged with a number of memory cells in the form of an X-Y matrix. As shown in detail in FIG. 4 which illustrates a memory cell portion, the memory matrix 26 has many sets of word lines W1, W2 and data lines D, $\overline{D}$ that run in the direction of rows and in the direction of columns, each set being composed of a pair of lines. In each pair of word lines W1, W2, though the details will be described later, one (W1) is used for writing the data. During a writing operation, this line (W1) is selected and driven to assume the "L" level (low logic level). The other line (W2) is used for reading the data. During a reading operation, this line (W2) is selected and driven to assume the "L" level.

Responsive to a read/write control signal R/W, the word line driver 22 selects and drives either one of the word line W1 or W2 of a row designated by X-select signals $X_0$ to $X_m$ sent from the X-decoder 21.

The data input buffer 25 operates when the read/write control signal R/W is in the writing state, and transmits a write data $D_{in}$ input from an external unit to the data lines D, $\overline{D}$ of a column designated by Y-select signals $Y_0$ to $Y_n$ sent from the Y-decoder 24.

The Y-select circuit 23 contains a read sense circuit, operates when the read/write control signal R/W is in the reading state, and reads the data of a cell selected by data lines D, $\overline{D}$ of a column designated by Y-select signals $Y_0$ to $Y_n$ from the Y-decoder 24, and produces the data. The read data $D_{out}$ is sent to an external unit via the output buffer 28 which consists of an IIL.

The X-decoder 21 and Y-decoder 24 produce X-select signals $X_0$ to $X_m$ and Y-select signals $Y_0$ to $Y_n$, respectively, responsive to address data $A_0$ to $A_k$ sent from an external unit via the address buffer 20.

Figure 4:
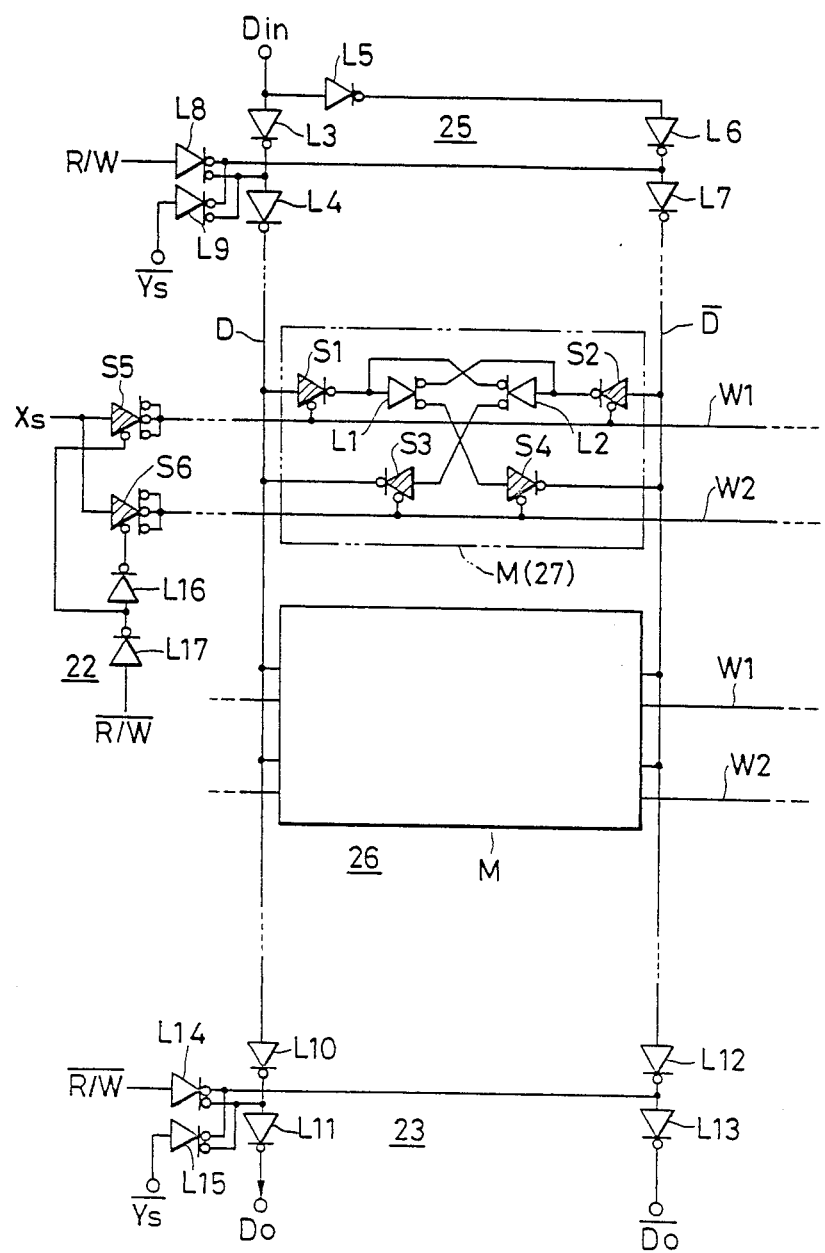
FIG. 4 is a diagram showing the circuit structure of a major portion in the IIL RAM.

FIG. 4 shows a major portion of the above-mentioned semiconductor memory in which a memory cell M is constituted by a holding circuit which consists of IIL's (L1, L2). The memory cell M is selected from the X- and Y-directions by the word lines W1, W2 and data lines D, $\overline{D}$.

Each memory cell M has the holding circuit consisting of IIL's (L1, L2), and has tri-state gates S1, S2, S3 and S4. The tri-state gates S1 to S4 are interposed between portions of the memory cell M and the data lines D, $\overline{D}$. Specifically, they are interposed between a set/reset terminal of the holding circuit consisting of IIL's (L1, L2) and the data lines D, $\overline{D}$. The tri-state gates S1 to S4 produce outputs of two logic states, i.e., outputs of high and low logic states, as well as an output of an electrically opened high-impedance state (floating condition).

The output state of the tri-state gates S1 to S4 is controlled by an X-select signal Xs (any one out of $X_0$ to $X_m$) that is given via word lines W1, W2. When the word line W1 for writing is selected and driven, the tri-state gates S1, S2 produce two logic outputs of high and low levels, and the remaining tri-state gates S3, S4 produce outputs of the electrically neutral high-impedance condition. When the data is to be written, therefore, memory cell M of the selected row only is connected to the word lines D, $\overline{D}$, so that the write data $D_{in}$ from the data input buffer 25 can be written thereon. Memory cells of other non-selected rows are completely separated from the data lines D, $\overline{D}$.

When the word line W2 for reading is selected and driven, the tri-state gates S3, S4 produce two logic outputs of high and low levels, and the remaining tri-state gates S1, S2 produce outputs of the electrically neutral high-impedance state. When the data is to be read, therefore, the memory cell M of the selected row only is connected to the data line D, $\overline{D}$, and the contents of only the selected memory cell M appear on the data lines D, $\overline{D}$. The contents appearing on the data lines D, $\overline{D}$ are selectively read by the Y-select circuit 23. In this case, the memory cells of other non-selected rows are all separated completely from the data lines D, $\overline{D}$.

Figure 5:
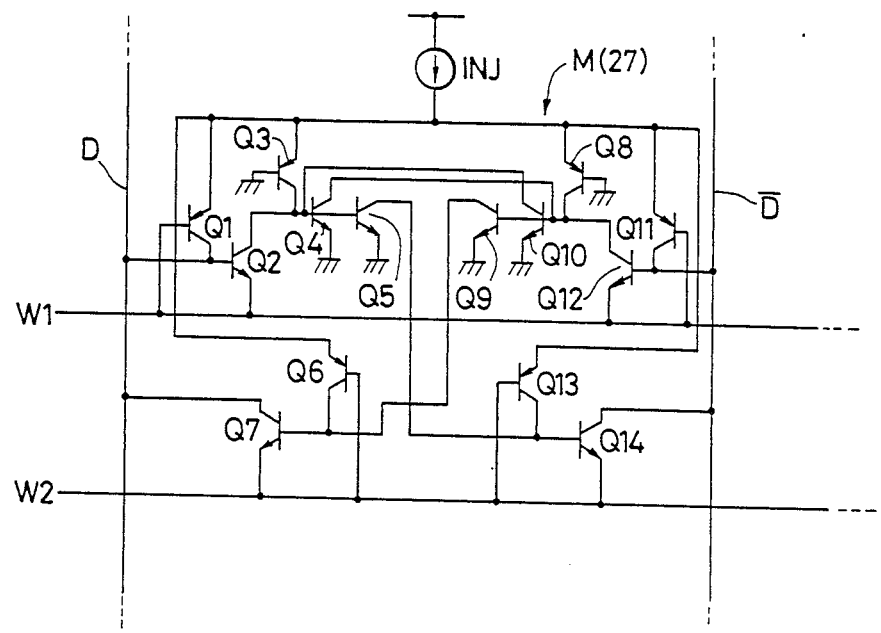
FIG. 5 is a diagram which schematically illustrates the circuit structure of a memory cell of FIG. 4.

Thus, the memory cell M of the selected row only is connected, via data lines D, $\overline{D}$, to the data input buffer circuit 25 or to the Y-select circuit 23, to perform a writing or reading operation. FIG. 5 is a circuit diagram of the memory cell which is schematically drawn on the element level. It will be recognized that the circuit is fundamentally constituted by the IIL's only without having any complex element construction. The tri-state circuit S1 is formed of Q1 and Q2, tri-state circuit S2 by Q11 and Q12, tri-state circuit S3 by Q6 and Q7, and tri-state circuit S4 by Q13 and Q14 (each in conjunction with injector INJ). Data holding circuit L1 is formed by Q3, Q4 and Q5 and data holding circuit L2 is formed by Q8, Q9 and Q10. Regarding tri-state circuits S3 and S4, it should be noted that their transistors Q6 and Q13 (which correspond to the transistor Qp of FIG. 1(d)) could also have their bases connected to ground rather than to W2. This is an alternative arrangement for the tri-state circuit which will still be able to operate in a floating state based on emitter control of Q7 and Q14 by the word line W2.

Peripheral circuits such as word line driver 22, data input buffer circuit 25, and Y-select circuit 23 will be described below briefly. As shown in FIG. 4, these peripheral circuits are also constituted using IIL's (L3 to L17) and tri-state gates S5, S6.

The word line driver 22 consists of tri-state gates S5, S6 having a large fan-out, and IIL's (L16, L17), and operates when the X-select signal Xs is at the "H" (high) level, so that the word line W1 or W2 of the corresponding row assumes the "L" level. At this moment, output states of the tri-state gates S5, S6 are controlled by the read/write control signal R/W via IIL's (L16, L17). When the read/write control signal R/W is at the "L" ($\overline{R/}$ = "H") level, i.e., in the writing state, only the word line W1 for writing is rendered to assume the "L" level, and the word line W2 for reading assumes the high-impedance state. Conversely, when the read/write control signal R/W has the "H" ($\overline{R/}$ = "L") level, i.e., in the reading state, only the word line W2 for reading is rendered to assume the "L" level, and the word line W1 for writing assumes the high-impedance state.

The data input buffer 25, which consists of IIL's (L3 to L9), divides the write data $D_{in}$ into positive logic and negative logic, and puts them on the data lines D, $\overline{D}$ when the Y-select signal Ys is in the select state ($\overline{Ys}$ = "L") and when the read/write control signal R/W has the "L" level, i.e., is in the write state.

The Y-select circuit 23 is also constituted by IIL's (L10 to L15). When the Y-select signal Ys is in the select state ($\overline{Ys}$ = "L") and the read/write control signal R/W is in the read state ($\overline{R/}$ = "L"), the Y-select circuit 23 reads the read data $D_0$, $\overline{D_0}$ that appear in a complementary manner on the read data lines D, $\overline{D}$, and produces it.

Note that the relation of the Y-select circuit 23 with regard to the sense circuit which reads the data is not based upon a sense amplifier circuit that has analog elements, but is very simply constructed by IIL's (L10 to L15) which are mere logic elements. This is accomplished owing to the fact that the memory cells M of the selected row only are connected to the data lines D, $\overline{D}$ through the tristate gates S3, S4. Therefore, the read output from the selected memory cell M can be taken out from the ends of data lines D, $\overline{D}$ maintaining the logic level of IIL without interference by memory cells of other non-selected rows. Accordingly, the read sense circuit can be constituted by logic elements IIL's (L10, L12) alone. Moreover, an increased number of memory cells can be arranged along the data lines D, $\overline{D}$, and the memory capacity can be increased.

Though not diagramed, other peripheral circuits have also been constituted by the IIL's or the tristate gates. As mentioned earlier, the tri-state gate Sx used here is very simple in construction, and is substantially constituted by only one IIL element. Further, since the element structure is almost the same as the IIL element the tri-state element can be formed simultaneously with the IIL element without increasing the number of steps. The tri-state gate further inherits the advantage of the IIL. Therefore, by providing a plurality of tri-state gates for every memory cell, the memory capacity of the memory cell can be increased while maintaining its size small.

As mentioned above, the RAM reliably precludes interference from the memory cells of non-selected rows, operates at an increased speed, and enables the peripheral circuits and, particularly, the read sense circuit to be simply constructed Further, the RAM operates reliably, and is adapted to be very densely integrated to increase the capacity Moreover, the RAM consumes electric power in relatively small amounts, and makes it easy to lay out the device together with analog circuits.

EMBODIMENT 2

Figure 6:
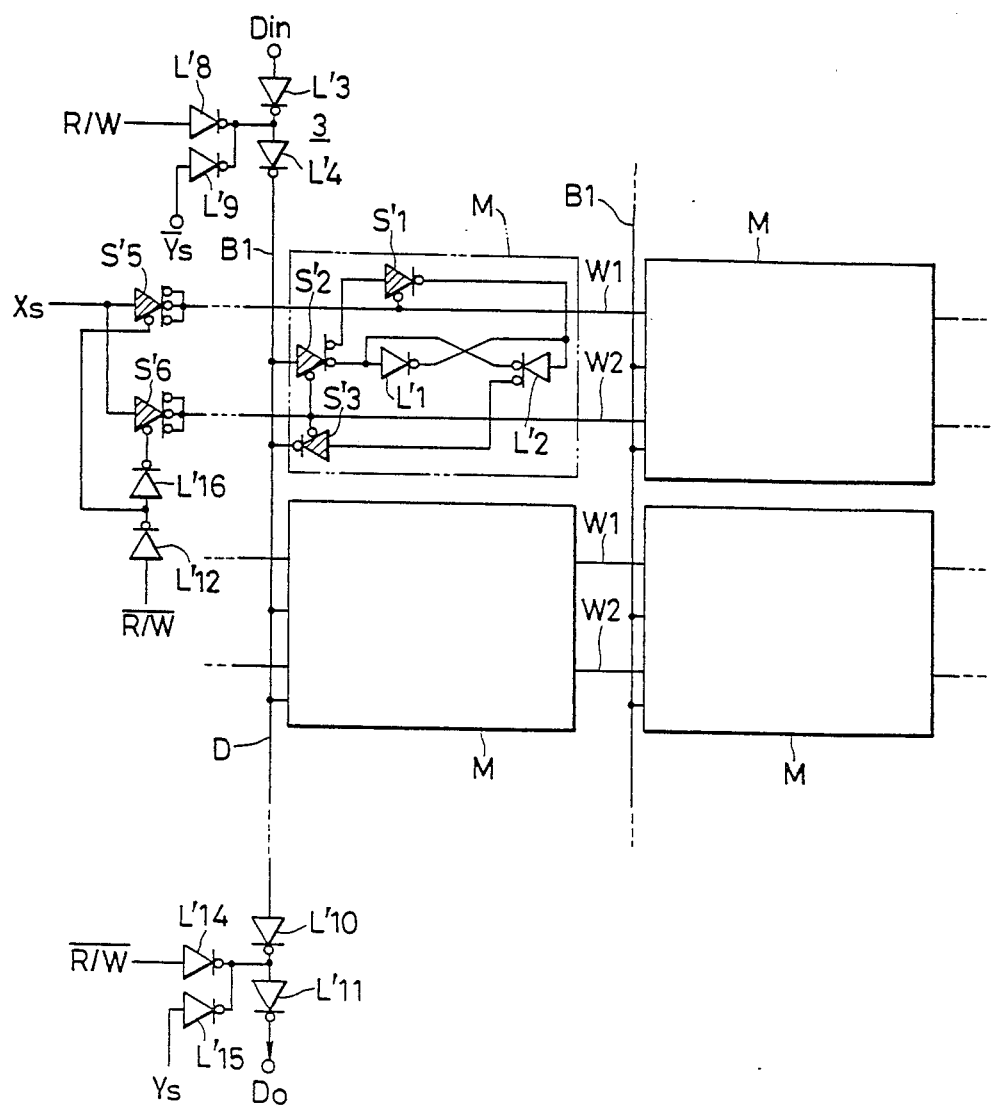
FIG. 6 is a diagram showing the circuit structure of a major portion of IIL RAM according to a second embodiment of the present invention.

FIG. 6 shows a second embodiment of the present invention.

The following description chiefly deals with these points that are different from the aforementioned first embodiment.

In the above-mentioned embodiment, two data lines D, $\overline{D}$ are provided for each select column (Y-column). As mentioned above, however, it is possible to take out the read output of the selected memory cell M through the ends of the data lines maintaining the logic level without interference from other non-selected memory cells. To take out the read output, therefore, the two data lines D, $\overline{D}$ are not necessarily required for each select column.

According to this embodiment, therefore, only one data line is provided for each select column as shown in FIG. 6, and the data is written or read out through one data line D. This makes it possible to halve the total number of data lines D, and to reduce the tri-state gates by one i.e., to reduce into S'1 to S'3 in each memory cell M. Further, since only one data line D is used for each column, the number of logic elements IIL's can be greatly reduced in the data input buffer circuit 25 and in the Y-select circuit 23. In the memory cell M, the tri-state gates S'1 to S'3 are reduced from four in the first embodiment to three. Among the three tristate gates, the two (S'1, S'2) are used for writing, and the remaining one (S'3) is used for reading.

Effects of the IIL RAM mentioned in the embodiments 1, 2 are summarized below. (1) Memory cells of the semiconductor memory are constituted by IIL's, and memory cells of the selected row only are connected to the data lines through the tri-state gates. Therefore, the memory reliably precludes interference from the memory cells of non-selected rows, operates at an increased speed, and enables the peripheral circuits and, particularly, the read sense system to be simply constructed. Further, the memory operates reliably, and is adapted to be highly densely integrated to increase the capacity. Moreover, the memory consumes electric power in relatively small amounts, and makes it easy to lay out the device together with analog circuits.

(2) Further, the tri-state gate forms an IIL consisting of a lateral-type bipolar transistor that works as an injector and a reversed-type npn bipolar transistor that works as an inverter. For example, referring to FIGS. 1(a) and 1(d), a common region between the base of the pnp bipolar transistor Qp and the emitter of the npn bipolar transistor Qn floats from the ground potential, and a control terminal IN2 is taken out from the common region of the floating condition to control the output condition of the IIL. Therefore, the tri-state gate is very compactly constituted with the size of one IIL. This makes it possible to limit the size of the memory cells and, hence, to further greatly increase the memory capacity.

EMBODIMENT 3

According to the third embodiment, the feature resides in that only one word line is used to write and read the data instead of using the two word lines W1, W2, and instead, two data lines are used to write and read the data separately.

Figure 7:
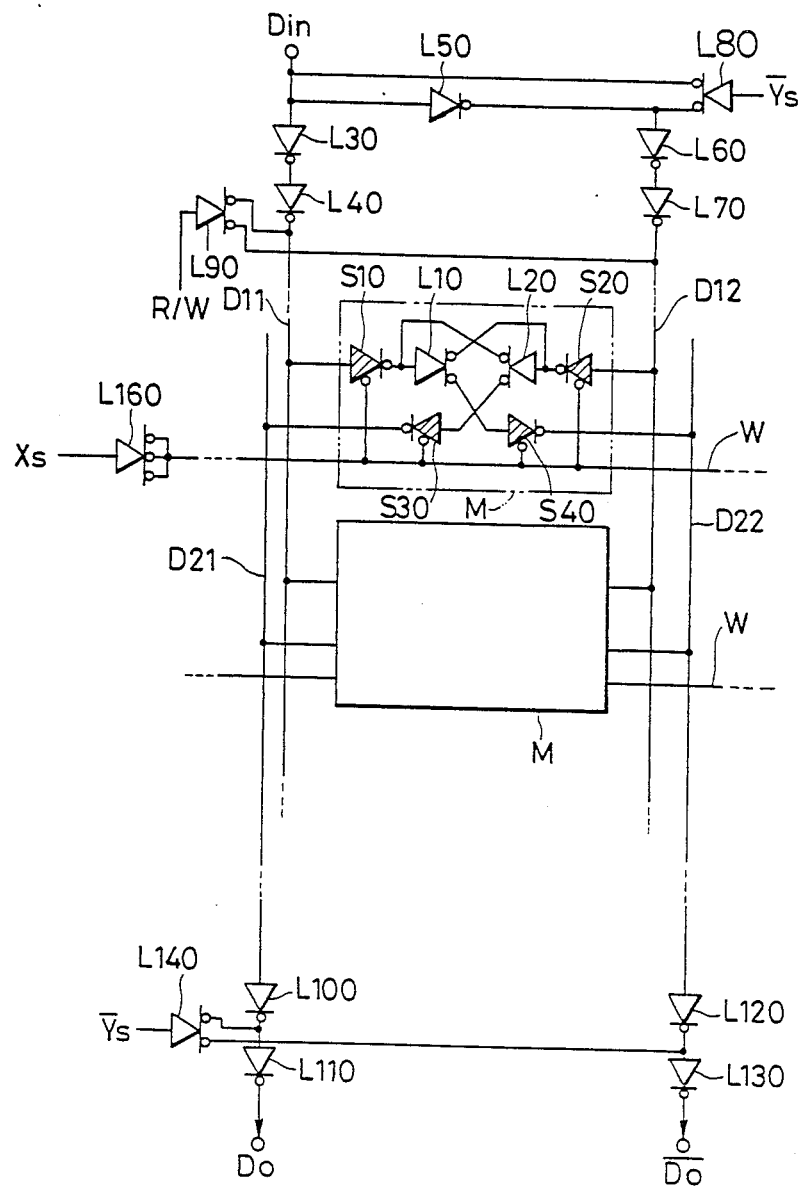
FIG. 7 is a diagram showing the circuit structure of a major portion of IIL RAM according to a third embodiment of the present invention.

FIG. 7 shows a major portion of the above semiconductor memory, wherein a memory cell M is constituted by a holding circuit which consists of IIL's (L10, L20). The memory cell M is selected from the X- and Y-directions by the word line W and by the data lines D11, D12, D21, D22.

Each memory cell M has a holding circuit consisting of IIL's (L10, L20), and has tri-state gates S10, S20, S30, S40 which are so constructed as to produce outputs of two logic states, i.e., outputs of high and low levels, as well as an output of an electrically opened high-impedance state. The tristate gates S10 to S40 are interposed between portions of the memory cell M and the data lines D11, D12, D21, D22. Among these tri-state gates S10 to S40, the two gates (S10, S20) are interposed between the write input side of the memory cell M and the data lines D11, D12 for writing. The remaining two gates (S30, S40) are interposed between the read output side and the data lines D21, D22 for reading.

The output state of the tri-state gates S10 to S40 is controlled by an X-select signal Xs (one of $X_0$ to $X_m$) that is given through the word line W. As the word line W is selected to assume the "L" level, the tri-state gates S10 to S40 on the selected word line W produce two logic outputs of high and low levels. The tri-state gates of other non-selected rows produce outputs of the electrically neutral high-impedance state. This enables the memory cell M of the selected row only to be connected to the data lines D11, D12, D21, D22, so that the data can be written or read. Memory cells of other non-selected rows are all completely separated from the data lines D11, D12, D21, D22.

Thus, the memory cell M of the selected row only is connected to the data input buffer circuit 25 (see FIG. 3) and to the Y-select circuit 23 via the data lines D11, D12, D21, D22, and writing or reading is carried out.

Peripheral circuits such as word line driver 22, data input buffer circuit 25, and y-select circuit 23 will be described below briefly. As shown in FIG. 7, these peripheral circuits are also constituted using IIL's (L30 to L160).

The word line driver 22 consists of an IIL (L160) having a large fan-out, and operates when the X-select signal Xs is at the "H" (high) level, so that the word line W of the corresponding row assumes the "L" level. At this moment, the word line W is selected and driven when either writing or reading is carried out, irrespective of the condition of the read/write control signal R/W.

The data input buffer 25 consists of IIL's (L30 to L90), and divides the write data $D_{in}$ into positive logic and negative logic, and gives them to the data lines D11, D12 for writing when the Y-select signal Ys is in the select state ($\overline{Ys}$="L") and when the read/write control signal R/W is in the write state (R/W ="L").

The Y-select circuit 23 is also constituted by IIL's (L100 to L140). When the Y-select signal Ys is in the select state ($\overline{Ys}$="L") and the read write control signal R/W is in the read state ($\overline{R}/$ ="L" so R/W ="H"), the Y-select circuit 23 reads the read data $D_0$, $\overline{D_0}$ that appear in a complementary manner on the read data lines D21, D22, and produces them.

Note that the relation of the Y-select circuit 23 with regard to the sense circuit which reads the data is not based upon a sense amplifier circuit that has analog elements, but is very simply constructed by IIL's (L100, L120) which are mere logic elements, as mentioned in the foregoing embodiment.

EMBODIMENT 4

Figure 8:
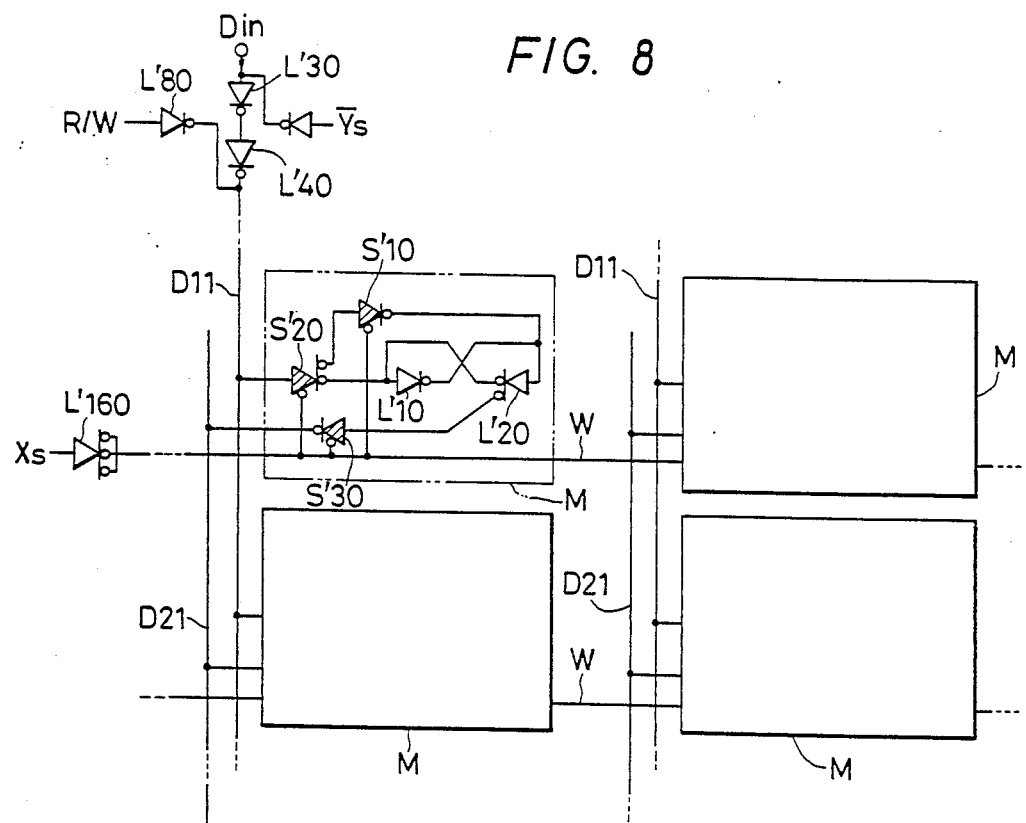
FIG. 8 is a diagram showing the circuit structure of a major portion of IIL RAM according to a fourth embodiment of the present invention.

FIG. 8 shows a fourth embodiment of the present invention.

The following description chiefly deals with those points that are different from the aforementioned third embodiment.

In the above-mentioned embodiment, four data lines D11, D12, D21, D22 are provided for each select column (Y-column). As mentioned above, however, the non-selected memory cells are completely separated from the data lines D11 to D22 by the tristate gates. Moreover, it is possible to take out the read output of the selected memory cell M through the ends of the data lines D21, D22 for reading, maintaining the logic level without interference by other non-selected memory cells. To take out the read output, therefore, the four data lines D11, D12, D21, D22 are not necessarily required for each select column.

In this embodiment, therefore, two data lines are used, one for writing and another one for reading, as shown in FIG. 8 in detail. Namely, the data line D11 is for writing and the data line S21 is for reading. This makes it possible to have the total number of data lines, and to reduce the number of tri-state gates by one in each of the memory cells. That is, the memory cell M contains three tri-state gates S'10, S'20, S'30. The gates S'10, S'20 are used for writing, and the gate S'30 is used for reading. Further, since only the data lines D11, S21 are used for reading and writing, respectively, the number of IIL's can be greatly reduced in the data input buffer circuit and in the Y-select circuit.

EMBODIMENT 5

A fifth embodiment of the present invention will be described below in conjunction with FIGS. 9(a), 9(b) and 10.

Figure 9A:
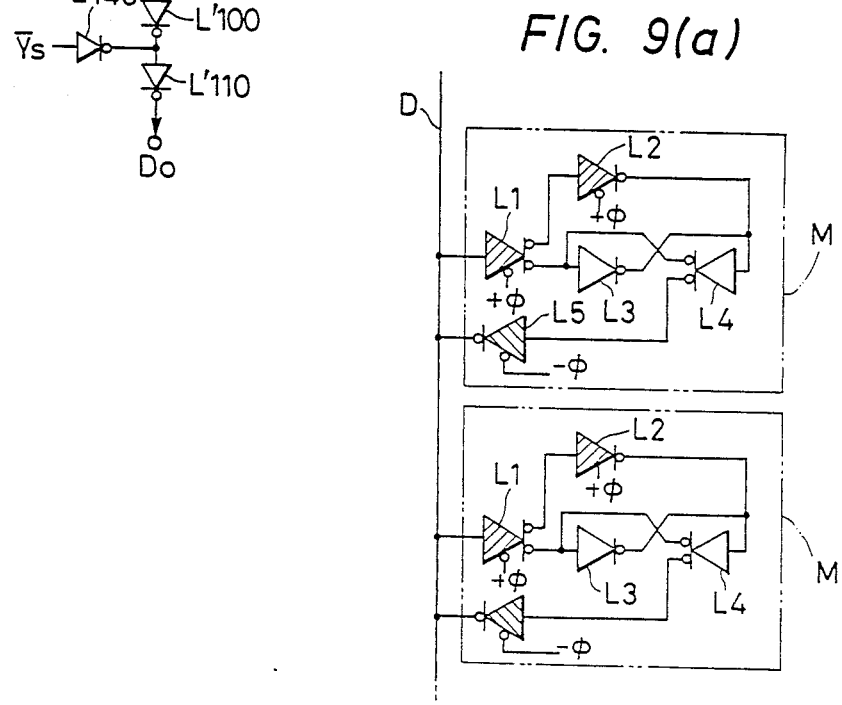
Figure 10:
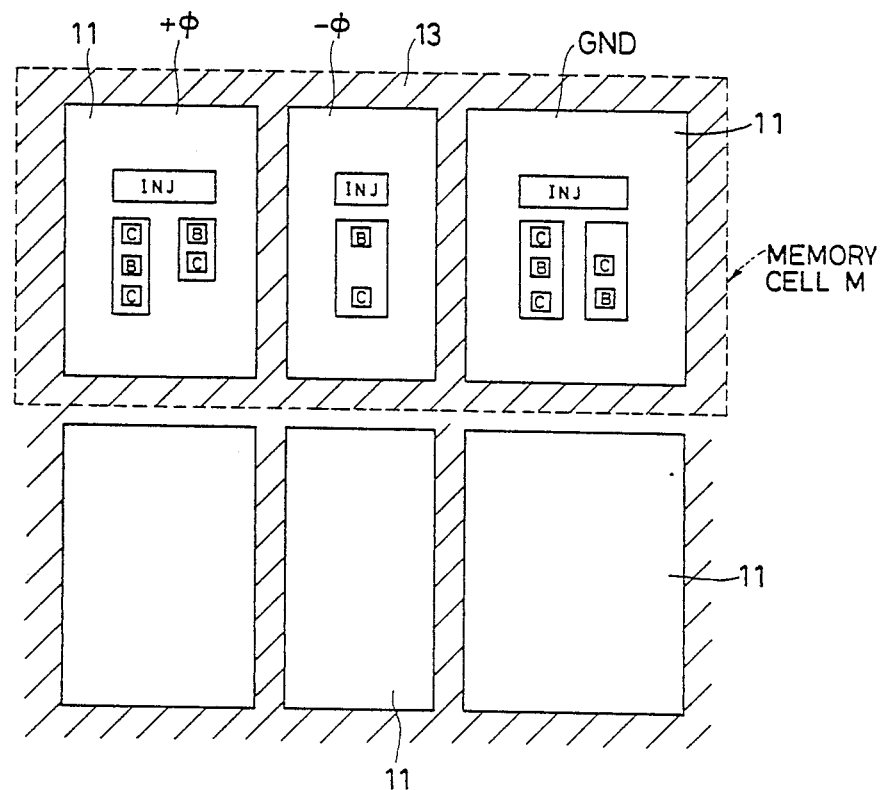
FIG. 10 is a plan view of the layout of the memory cell portion drawn by the inventors in order to clarify the effects obtained by the layout technique shown in FIG. 9.

FIG. 9(a) is a circuit diagram showing memory cells that are equivalent to those of IIL RAM shown in FIG. 6. For easy explanation of the circuit, the memory cell of FIG. 9(a) consists of five IIL gates L1 to L5, wherein symbol M represents the memory cell and D represents the data line. Symbols $+\phi$, $-\phi$ denote word select signals for controlling the state of the tri-state IIL's (L1, L2, L5). Here, the IIL's L1, L2 are controlled by the word select signal $+\phi$ of a positive phase, and the IIL L5 is controlled by the word select signal $-\phi$ of a reverse phase.

According to this embodiment, the feature resides in that among the tri-state IIL's, those which are activated maintaining the same phase are collectively formed on the same semiconductor island, in order to eliminate the regions for isolating the logic elements and, hence, to reduce the size of semiconductor chips.

The fifth embodiment will be described below with reference to the drawings in which the same reference numerals denote the same or corresponding portions.

Figure 9B:
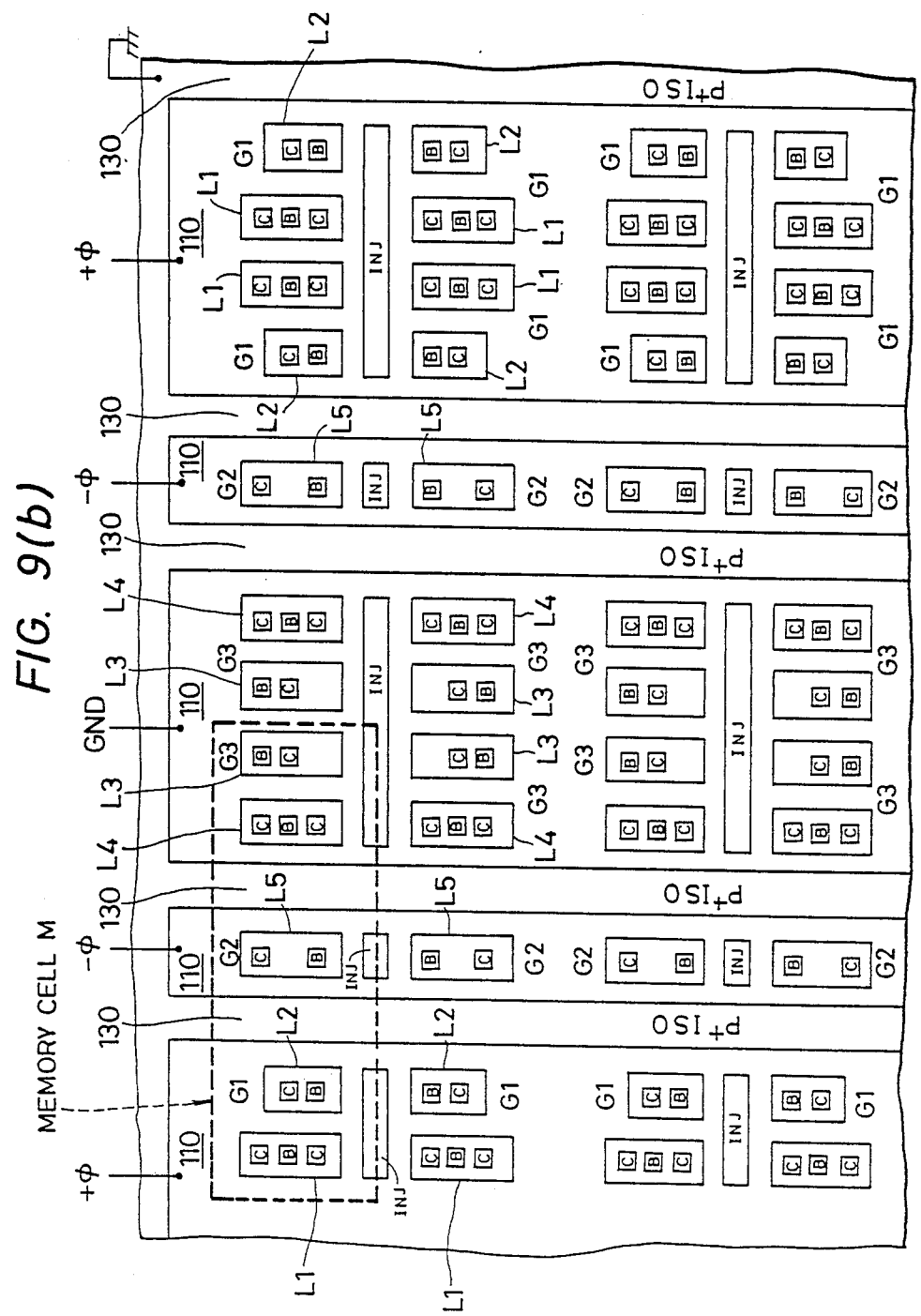

FIG. 9(b) shows a portion of layout of the semiconductor integrated circuit device according to the present invention. The semiconductor integrated circuit device which is partly shown in FIG. 9(b) is an IIL RAM made up of memory cells M of FIG. 9(a). The IIL's (L1, L2, L3, L4, L5) are contained in each memory cell. The memory cell M of each unit is enclosed by a broken line, which is smaller than that of FIG. 10.

In FIG. 9, symbols L3, L4 denote ordinary IIL's, and L1, L2, L5 denote the aforementioned tri-state IIL's.

Here, the five IIL's (L1, L2, L3, L4, L5) which constitute a memory cell are divided into three groups G1, G2, G3 consisting of L1 and L2, L3 and L4, and L5. These groups G1, G2, G3 are collectively formed on the same semiconductor islands 110, respectively, among the neighboring memory cells.

In FIG. 9(b), reference numeral 110 denotes epitaxial layer portions that form semiconductor islands, and 130 denotes isolation regions. Symbol C denotes the collector of an IIL, B denotes the base of an IIL, and INJ denotes the injector.

Here, the states of tri-state IIL's (L1, L2) of the group G1 are controlled maintaining the same phase by the word select signal $+\phi$ of positive phase. The state of tri-state IIL (L5) of the group G2 is controlled by the word select signal $-\phi$ of reverse phase maintaining the same phase among the memory cells. As for IIL's (L3, L4) of the group G3, the reference potential region 110 is connected to ground potential GND at all times.

As described above, the semiconductor regions (epitaxial layers 110) of tri-state IIL's (L1, L2, L5) that are activated maintaining the same phase among the neighboring memory cells, are collectively formed on the same semiconductor islands, and the states of the tri-state IIL's are controlled with an island as a unit, making it possible to greatly reduce the isolation regions 130 among the IIL's. This makes it possible to greatly reduce the size of the semiconductor chip and, hence, to form an IIL-RAM of a large capacity. The fifth embodiment exhibits the effect as described below. That is, of the tri-state IIL's, those which are activated in phase are collectively formed on the same semiconductor island to reduce the region for isolating logic elements. This makes it possible to reduce the size of the semiconductor chip.

EMBODIMENT 6

A sixth embodiment deals with the case where a logic circuit of a small size which consumes small amounts of electric power is constituted using tristate IIL's. FIG. 11 shows the case where an Ex-NOR circuit is constituted by the IIL's.

Figure 11A:
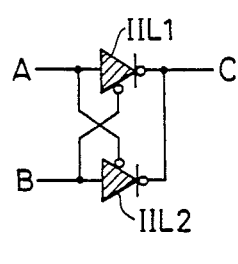
FIG. 11(a) is a diagram of an exclusive NOR circuit which is a concrete example of a logic circuit of the present invention.

FIG. 11(a) shows an Ex-NOR circuit constituted by two logic elements IIL1 and IIL2. The truth table of operation thereof is as given below.

| | | | Truth table | | |
|---|---|---|---|---|---|
| A | B | C | IIL1 | IIL2 | Ii |
| L | L | H | ON | ON | 2 |
| L | H | L | OFF | ON | 1 |
| H | L | H | ON | OFF | 1 |
| H | H | H | OFF | OFF | 0 |

Figure 11B:
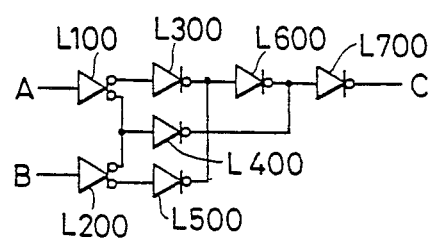
FIG. 11(b) is a diagram showing the structure of the above-mentioned circuit that is constituted without adapting the present invention.

The Ex-NOR circuit is one of very important fundamental logic circuits, and is utilized for a full adder in an ALU (logical operation unit) of, for example, a microcomputer. If ordinary ILL's are used, this Ex-NOR circuit can be constituted using as many as seven IIL's (L100 to L700) as shown in FIG. 11(b).

Using the tri-state IIL's as mentioned above, the Ex-NOR circuit can be constituted with a very small number of elements. The consumption of electric power can be reduced with the decrease in the number of elements. Here, however, attention should further be given to the fact that with the circuit of FIG. 11(a), the injector current Ii does not necessarily flow into the two elements IIL1, IIL2 simultaneously at all times, but flows into either one of the element IIL1 or IIL2, or into neither element depending upon the operation condition of the circuit, as indicated by ON/OFF in the truth table. Therefore, though the circuit of FIG. 11(a) has elements of a number which is reduced to 2/7 compared with the circuit of FIG. 11(b), its average power consumption is further greatly reduced. If it is presumed that the logic inputs A, B assume the H (high) level and the L (low) level nearly at the same rate, the injector current Ii of only one element IIL flows in average into the circuit of FIG. 11(a), which is about one-seventh the power consumption of the circuit of FIG. 11(b) (see the extreme right column of the truth table).

EMBODIMENT 7

The logic circuit of yet other embodiments will be described below in conjunction with the drawings.

FIG. 12 shows an embodiment where a comparator circuit is constituted using the above-mentioned elements IIL's.

FIG. 12 (a) shows the comparator circuit constituted by two logic elements IIL1, IIL2. The truth table of operation is as given below.

| A | B | X | Y | IIL1 | IIL2 | Ii |
|---|---|---|---|------|------|----|
| 0 | 0 | 1 | 1 | ON   | ON   | 2  |
| 0 | 1 | 1 | 0 | OFF  | ON   | 1  |
| 1 | 0 | 0 | 1 | ON   | OFF  | 1  |
| 1 | 1 | 1 | 1 | OFF  | OFF  | 0  |

Symbols X, Y indicate decision output A>B or A<B in binary notation using 1 and 0.

This comparator circuit is a very important fundamental logic circuit and is used for determining the branching condition in, for example, a microcomputer. If ordinary IIL's are used, the comparator circuit can be constituted using as many as six IIL's (L'100 to L'600) as shown in FIG. 12(b).

Figure 12A:
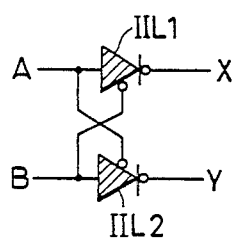
FIG. 12(a) is a diagram showing the structure of an input signal comparator circuit which is another example of a logic circuit of the present invention.
Figure 12B:
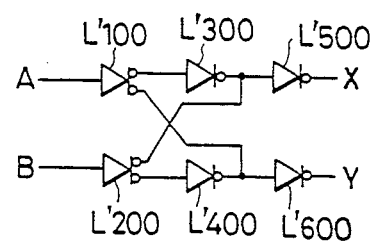
FIG. 12(b) is a diagram showing the structure of the above-mentioned circuit that is constituted without adapting the present invention.

Using the IIL's shown in FIG. 1, however, the comparator circuit can be constituted using only two elements IIL1, IIL2 as shown in FIG. 12(a). The average consumption of electric power can also be reduced by more than the reduction in the number of elements because of the reasons described above.

EMBODIMENT 8

Figure 13:
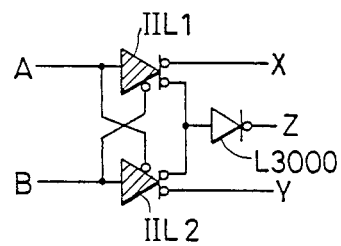
FIG. 13 is a diagram showing the structure of the input signal comparator circuit which is a further example of a logic circuit of the present invention.

FIG. 13 shows a further embodiment when the comparator circuit is constituted by the above-mentioned elements IIL's.

The comparator circuit of FIG. 12(a) can determine only the relation A>B. By adding an inverter consisting of an ordinary element IIL (L3000) as shown in FIG. 13, however, the comparator circuit becomes capable of determining not only A>B and A<B but also A=B. The truth table of operation is as given below.

| | | Truth table | | |
|---|---|---|---|---|
| A | B | X | Y | Z |
| 0 | 0 | 1 | 1 | 0 |
| 0 | 1 | 1 | 0 | 1 |
| 1 | 0 | 0 | 1 | 1 |
| 1 | 1 | 1 | 1 | 0 |

The comparator circuit with the equal sign is also a very important fundamental logic circuit, and is used for determining the branching condition in, for example, a microcomputer. This circuit consumes a greatly reduced amount of electric power on the average because of the reasons as described above.

The aforementioned embodiments 6 to 8 produce the effects as described below.

(1) Potential on the grounding side of IIL's is controlled by a logic signal, whereby the logic circuit is simply constituted by the IIL's. Further, operation current does not flow into the IIL's that are not in operation, and the logic circuit consisting of IIL's consumes greatly reduced amounts of electric power on the average.

(2) The IIL's which can be highly densely integrated and which operate at high speeds, make it possible to easily form a large digital system.

We claim:

1. A semiconductor integrated circuit device comprising:

a plurality of memory cells which store data therein;

a plurality of first word lines coupled to said plurality of memory cells so that each memory cell is coupled to a first word line and a pair of first complementary data lines;

an address circuit coupled to said first word lines and to said first complementary data line pairs, said address circuit including means for selecting a predetermined memory cell by producing a first word line select signal to select a predetermined first word line and producing a complementary data line pair-select signal to select a predetermined pair of first complementary data lines, wherein each of said plurality of memory cells includes a data holding circuit having a pair of data input terminals and a pair of first transfer gates disposed between said data input terminals and the corresponding pair of first complementary data lines, wherein said pair of first transfer gates comprises tri-state gates, and wherein the control terminals of said tri-state gates comprising said pair of first transfer gates are coupled to the corresponding word line so that sad tri-state gates are controlled by the word line select signal a power supply terminal for supplying an operating voltage to said semiconductor integrated circuit device;

a plurality of current sources coupled to said power supply terminal; and said tri-state gates being interconnected within said semiconductor integrated circuit device, each tri-state gate having an input terminal, at least one output terminal and a control terminal, and each of said plurality of tri-state gates further including first and second bipolar transistors, said first bipolar transistor having a base coupled to said input terminal, an emitter coupled to said control terminal and at least one collector coupled to said at least one output terminal, said second bipolar transistor having an emitter coupled to one ofsaid plurality of current sources, a base coupled to said control terminal and a collector coupled to said input terminal;

wherein said output terminal of each tri-state gate becomes a floating condition regardless of an input signal applied to said input terminal when a control signal applied to said control terminal has a first level so that said first and second bipolar transistors are turned off, and wherein each tri-state gate provides a signal having a selected one of a high or low level in response to the input signal applied to said input terminal when the control signal applied to said control terminal has a second level so that said second bipolar transistor is turned on and said first bipolar transistor is in either an on or off state in response to the input signal.

2. A semiconductor integrated circuit device according to claim 1, wherein said data holding circuit is comprised of IIL elements.

3. A semiconductor integrated circuit device according to claim 1, further comprising;
- a plurality of second word lines coupled to said address circuit and to said plurality of memory cells so that each memory cell is coupled to a second word line; and
- said address circuit further including means for selecting a predetermined memory cell by producing a second word line select signal to select a predetermined second word line;
- wherein each of said plurality of memory cells further includes a pair of data output terminals and a pair of second transfer gates disposed between said pair of data output terminals and the corresponding pair of first complementary data lines,
- wherein said pair of second transfer gates comprises said tri-state gates,
- and wherein the control terminals of said tri-state gates comprising said pair of second transfer gates are coupled to the corresponding second word line so that said tri-state gates are controlled by the second word line select signal.

4. A semiconductor integrated circuit device according to claim 3, further comprising:
- sense means coupled to each of said plurality of first complementary data lines for detecting data stored in the predetermined memory cell,
- wherein said sense means include integrated injection logic gates.

5. A semiconductor integrated circuit device according to claim 1, further comprising:
- a plurality of pairs of second complementary data lines coupled to said plurality of memory cells so that each memory cell is coupled to a pair of second complementary data lines,
- wherein each of said plurality of memory cells further includes a pair of data output terminals and a pair of third transfer gates comprising said tri-state gates disposed between said pair of data output terminals and the corresponding pair of second complementary data lies,
- wherein the control terminals of said tri-state gates comprising said pair of transfer gates are coupled to the corresponding first word line so that said tri-state gates are controlled by the first word line select signal,
- and wherein said plurality of pairs of first complementary data lines deliver data to be written into said memory cells and said plurality of pairs of second complementary date lines deliver data to be read out from the memory cells.

6. A semiconductor integrated circuit device comprising;
- a plurality of memory cells which store data therein;
- a plurality of word lines and a plurality of data lines coupled to said plurality of memory cells so that each memory cell is coupled to a word line and a data line;
- an address circuit coupled to said world lines and to said data lines, said address circuit including means for selecting a predetermined memory cell by producing a word line select signal to select a predetermined word line and producing a data line select signal to select a predetermined data line;
- wherein each of said memory cells includes a data holding circuit having a data input terminal and a data output terminal, a first transfer gate disposed between said data input terminal and the corresponding data line and a second transfer gate disposed between said output terminal and the corresponding data line,
- wherein said first and second transfer gates comprises tri-state gates, and
- wherein the control terminals of said tri-state gates are coupled to the corresponding word line so that said tri-state gates are controlled by the word line select signal;
- a power supply terminal for supplying an operating voltage to said semiconductor integrated circuit device;
- a plurality of current sources coupled to said power supply terminal; and
- said tri-state gates being interconnected within said semiconductor integrated circuit device, each tri-state gate having an input terminal, at least one output terminal and a control terminal, and each of said plurality of tri-state gates further including first and second bipolar transistors, said first bipolar transistor having a base coupled to said input terminal, an emitter coupled to said control terminal and at least one collector coupled to said at least one output terminal, said second bipolar transistor having an emitter coupled to one of said plurality of current sources, a base coupled to said control terminal and a collector coupled to said input terminal;
- wherein said output terminal of each tri-state gate becomes a floating condition regardless of an input signal applied to said input terminal when a control signal applied to said control terminal has a first level so that said first and second bipolar transistors are turned off, and
- wherein each tri-state gate provides a signal having a selected one of a high or low level in response to the input signal applied to said input terminal when the control signal applied to said control terminal has a second level so that said second bipolar transistor is turned on and said first bipolar transistor is in either an on or off state in response to the input signal.

7. A semiconductor integrated circuit device comprising;
- a plurality of memory cells which store data therein;
- a plurality of word lines and a plurality of first and second data lines coupled to said plurality of memory cells so that each memory cell is coupled to a word line and first and second data lines;
- an address circuit coupled to said word lines and to said data lines, said address circuit including means for selecting a predetermined memory cell by producing a word line select signal to select a predetermined word line and producing a data line select signal to select predetermined first and second data lines;
- wherein each of said memory cells includes a data holding circuit having a data input terminal and a data output terminal, a first transfer gate disposed between said data input terminal and the corresponding first data line and a second transfer gate disposed between said output terminal and the corresponding second data line,
- wherein said first and second transfer gates comprises tri-state gates,
- wherein the control terminals of said tri-state gates are coupled to the corresponding word line so that said tri-state gates are controlled by the word line select signal, and wherein said plurality of first data lines deliver data to be written into said memory cells and said plurality of second data lines deliver data to be read-out from said memory cells, a power supply terminal for supplying an operating voltage to said semiconductor integrated circuit device;

a plurality of current sources coupled to said power supply terminal; and said tri-state gates being interconnected within said semiconductor integrated circuit device, each tri-state gate having an input terminal, at least one output terminal and a control terminal, and each of said plurality of tri-state gates further including first and second bipolar transistors, said first bipolar transistor having a base coupled to said input terminal, an emitter coupled to said control terminal and at least one collector coupled to said at least one output terminal, said second bipolar transistor having an emitter coupled to one of said plurality of current sources, a base coupled to said control terminal and a collector coupled to said input terminal;

wherein said output terminal of each tri-state gate becomes a floating condition regardless of an input signal applied to said input terminal when a control signal applied to said control terminal has a first level so that said first and second bipolar transistors are turned off, and wherein each tri-state gate provides a signal having a selected one of a high or low level in response to the input signal applied to said input terminal when the control signal applied to said control terminal has a second level so that said second bipolar transistor is turned on and said first bipolar transistor is in either an on or off state in response to the input signal.

8. A semiconductor integrated circuit device according to claim 7, wherein said data holding circuit in each of said plurality of memory cells includes integrated injection logic elements.

9. A semiconductor integrated circuit device according to claim 8, wherein said data holding circuit in each of said plurality of memory cells includes integrated injection logic elements.

10. A semiconductor integrated circuit device comprising:

a power supply terminal for supplying an operating voltage to said semiconductor integrated circuit device;

a current source coupled to said power supply terminal;

a plurality of tri-state gates being interconnected within said semiconductor integrated circuit deice, each tri-state gate having an input terminal, at least one output terminal and a control terminal, and each of said plurality of tri-state gates further including first and second bipolar transistors, said first bipolar transistor having a base coupled to said input terminal, an emitter coupled to said control terminal and at least one collector coupled to said at least one output terminal, said second bipolar transistor having an emitter coupled to said current source, a base coupled to said control terminal and a collector coupled to said input terminal;

wherein said output terminal of each tri-state gate becomes a floating condition regardless of an input signal applied to said input terminal when a control signal applied to said control terminal have a first level so that said first and second bipolar transistors are turned off, and wherein each tri-state gate provides a signal having a selected one of a high or low level in response to the input signal applied to said input terminal when the control signal applied to said control terminal have a second level so that said second bipolar transistor is turned on and said first bipolar transistor is in either an on or off state in response to the input signal;

wherein said plurality of tri-stat gates are collectively provided in an island region formed in a semiconductor substrate, wherein the control terminals of said plurality of tri-state gates are constituted by said island region, and wherein said plurality of tri-state gates are commonly controlled by a potential level of said first island served as the control signal.

11. A semiconductor integrated circuit device comprising:

a power supply terminal for supplying an operating voltage to said semiconductor integrated circuit device;

a current source coupled to said power supply terminal;

a plurality of tri-state gates being interconnected within said semiconductor reintegrated circuit device, each tri-state gate having an input terminal, at least one output terminal and a control terminal, and each of said plurality of tri-state gates further including first and second bipolar transistors, said first bipolar transistor having a gate coupled to said input terminal, an emitter coupled to said control terminal and at least one collector coupled to said at least one output terminal, said second bipolar transistor having an emitter coupled to said current source, a base coupled to said control terminal and a collector coupled to said input terminal;

wherein said output terminal of each tri-state gate becomes a floating condition regardless of an input signal applied to said input terminal when a control signal applied to said control terminal have a first level so that said first and second bipolar transistors are turned off, and wherein each tri-state gate provides a signal having a selected one of a high or low level in response to the input signal applied to said input terminal when the control signal applied to said control terminal have a second level so that said second bipolar transistor is turned on and said first bipolar transistor is in either an on or off state in response to the input signal;

wherein said plurality of tri-state gates include a first type of tri-state gates and a second type of tri-state gates, wherein said first type of tri-state gates are provided in a first island region formed in a semiconductor substrate, wherein the control terminals of said first type of tri-state gates comprises said first island region, wherein the control terminals of said second type of tri-state gates comprises said second island region, and wherein said first and second types of tri-state gates are individually operated relative to each other by individually controlling potential levels of said first and second island region served as the control signal.

12. A tri-state gate coupled to a current source, said tri-state comprising:
an input terminal;
at least one output terminal;
a control terminal;
a first bipolar transistor having a base coupled to said input terminal, an emitter coupled to said control terminal and at least one collector coupled to said at least one output terminal;
a second bipolar transistor having an emitter coupled to said current source, a base coupled to said control terminal and a collector coupled to said input terminal;
wherein said output terminal of said tri-state gate becomes a floating condition regardless of an input signal applied to said input terminal when a control signal applied to said control terminal have a first level so that said first and second bipolar transistor are turned off, and
wherein said tri-state gate provides a signal having a selected one of high and low levels in response to the input signal applied to said input terminal when the control signal applied to said control terminal have a second level so that said second bipolar transistor is turned on and said first bipolar transistor is in on or off states in response to the input signal; and
means for providing said control signal to said control terminal;
wherein said first and second transistors are commonly formed in an island region of a first conductivity type in a semiconductor substrate of a second conductivity type with the emitter of the second transistor and the base of the first transistor being commonly formed by the island region, and further wherein said means for providing said terminal is coupled to the island region to supply the control signal to said control.

13. A tri-state gate according to claim 12, wherein said first bipolar transistor is an NPN transistor and said second bipolar transistor is a PNP bipolar transistor.

14. A tri-state gate according to claim 12, wherein said second level is a ground potential and wherein said first level is higher than said second level.

15. A tri-state gate according to claim 12, wherein said first and second bipolar transistor are formed by an integrated injection logic gate.

16. A semiconductor integrated circuit according to claim 1, wherein said first bipolar transistors are NPN bipolar transistor sand said second bipolar transistors are PNP bipolar transistor, and said second level is a ground potential level.

17. A semiconductor integrated circuit according to claim 16, wherein said first and second bipolar transistors are integrated injection logic gates.

18. A semiconductor integrated circuit according to claim 6, wherein said first bipolar transistors are NPN bipolar transistors and said second bipolar transistors are PNP bipolar transistors, and said second level is a ground potential.

19. A semiconductor integrated circuit according to claim 18, wherein said first and second bipolar transistors are integrated injection logic gates.

20. A semiconductor integrated circuit according to claim 7, wherein said first bipolar transistors are NPN bipolar transistors and said second bipolar transistors are PNP bipolar transistors, and said second level is a ground potential.

21. A semiconductor integrated circuit according to claim 20, wherein said first and second bipolar transistors are integrated injection logic gates.

22. A semiconductor integrated circuit according to claim 10, wherein said first bipolar transistors are NPN bipolar transistors and said second bipolar transistors are PNP bipolar transistors, and said second level is a ground potential level.

23. A semiconductor integrated circuit according to claim 22, wherein said first and second bipolar transistors are integrated injection logic gates.

24. A semiconductor integrated circuit according to claim 11, wherein said first bipolar transistors are NPN bipolar transistors and said second bipolar transistors are PNP bipolar transistors, and said second level is a ground potential.

25. A semiconductor integrated circuit according to claim 24, wherein said first and second bipolar transistors are integrated injection logic gates.

* * * * *